United States Patent
Feurprier

(10) Patent No.: US 7,935,640 B2
(45) Date of Patent: May 3, 2011

(54) METHOD FOR FORMING A DAMASCENE STRUCTURE

(75) Inventor: Yannick Feurprier, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 458 days.

(21) Appl. No.: 11/836,977

(22) Filed: Aug. 10, 2007

(65) Prior Publication Data

US 2009/0039518 A1    Feb. 12, 2009

(51) Int. Cl.
*H01L 21/302* (2006.01)
*H01L 21/461* (2006.01)

(52) U.S. Cl. ........ 438/738; 438/597; 438/622; 438/637; 438/706; 438/707; 438/710; 438/733; 438/734; 438/737

(58) Field of Classification Search .................. 438/597, 438/622, 637, 706, 707, 710, 733, 734, 737, 438/738

See application file for complete search history.

(56) References Cited

U.S. PATENT DOCUMENTS

| | | | |
|---|---|---|---|
| 6,103,619 A | 8/2000 | Lai | |
| 6,949,203 B2 | 9/2005 | Hsieh et al. | |
| 2002/0119677 A1 | 8/2002 | Soda et al. | |
| 2006/0134909 A1 | 6/2006 | Nagase et al. | |
| 2007/0004214 A1 | 1/2007 | Schaller et al. | |
| 2007/0032055 A1* | 2/2007 | Standaert et al. | 438/584 |
| 2007/0161290 A1 | 7/2007 | Fitzsimmons et al. | |
| 2007/0218699 A1* | 9/2007 | Yoshida | 438/710 |
| 2007/0222076 A1* | 9/2007 | Fukasawa et al. | 257/751 |
| 2007/0232048 A1* | 10/2007 | Miyata et al. | 438/597 |
| 2007/0243714 A1* | 10/2007 | Shin et al. | 438/706 |
| 2008/0020570 A1* | 1/2008 | Naik | 438/675 |

* cited by examiner

*Primary Examiner* — Kevin M Picardat
*Assistant Examiner* — Bac H Au
(74) *Attorney, Agent, or Firm* — Wood, Herron & Evans, LLP

(57) ABSTRACT

A method of forming a damascene structure comprises preparing a film stack on the substrate, wherein the film stack comprises a SiCOH-containing layer formed on the substrate, a silicon oxide ($SiO_x$) layer formed on the SiCOH-containing layer, and a first mask layer formed on the silicon oxide layer. A trench pattern is created in the first mask layer. The trench pattern in the first mask layer is transferred to the silicon oxide layer, and then the first mask layer is removed. A second mask layer is formed on the silicon oxide layer. A via pattern is formed in the second mask layer. The via pattern is transferred to the SiCOH-containing layer using a first etching process, and then the second mask layer is removed. The trench pattern is transferred to the SiCOH-containing layer using a second etching process with plasma formed from a process composition comprising $NF_3$.

14 Claims, 19 Drawing Sheets

METHOD FOR FORMING A DAMASCENE STRUCTURE

CROSS-REFERENCE TO RELATED APPLICATIONS

This application is related to co-pending U.S. patent application Ser. No. 11/836,957, entitled "METHOD FOR ETCHING LOW-K MATERIAL USING AN OXIDE HARD MASK", filed on even date herewith. The entire content of this application is herein incorporated by reference in its entirety.

BACKGROUND OF THE INVENTION

1. Field of the Invention

The present invention relates to a method for forming a damascene structure having a low dielectric constant (low-k) dielectric film on a substrate, and more particularly to a method for forming a damascene structure having a SiCOH-containing low-k film.

2. Description of Related Art

In material processing methodologies, pattern etching can comprise the application of a thin layer of radiation-sensitive material, such as photoresist, to an upper surface of a substrate that is subsequently patterned in order to provide a mask for transferring this pattern to the underlying thin film on a substrate during etching. The patterning of the radiation-sensitive material generally involves a lithographic process, wherein the radiation-sensitive material is exposed to a geometric pattern of electromagnetic (EM) radiation using, for example, a micro-lithography system, followed by the removal of the irradiated regions of the radiation-sensitive material (as in the case of positive resist), or non-irradiated regions (as in the case of negative resist) using a developing solvent.

Moreover, this lithographic mask layer may comprise multiple sub-layers. For example, the mask layer may further include an anti-reflective coating (ARC) underlying the layer of radiation-sensitive material. If the mask layer includes additional layers, such as an ARC layer, then the lithographic pattern formed in the layer of radiation-sensitive material may be transferred to the ARC layer using dry development techniques or wet development techniques.

These lithographic structures have been used to pattern features for front end of line (FEOL) operations, such as gate formation, as well as back-end-of-line (BEOL) operations, such as metal intra-/inter-connects. For example, a lithographic structure is often utilized in the preparation of dual damascene structures for BEOL operations. However, with the implementation of low dielectric constant (low-k) and ultra-low-k dielectric materials in BEOL structures, it has been recognized that the processes utilized for removing the lithographic mask can damage the dielectric material. Therefore, a hard mask layer (or layers) have been contemplated for insertion between the lithographic mask layer and the underlying dielectric material, wherein once the lithographic pattern is transferred to the hard mask layer (or layers), the lithographic mask layer may be removed, thus, reducing damage to the dielectric material.

Thereafter, the hard mask layer (or layers) may serve as the mask for patterning the dielectric material. In order to achieve sufficient etch selectivity between etching the dielectric material and etching the hard mask layer (or layers), metal hard mask layers, such as Ti-containing materials, Ta-containing materials, etc., have been contemplated. However, these metal hard masks pose additional problems, including, but not limited to, establishing an etch chemistry for patterning the metal hard mask, as well as removing the metal hard mask.

SUMMARY OF THE INVENTION

The invention relates to a method for patterning a thin film on a substrate.

Additionally, the invention relates to a method for forming a damascene structure in a low dielectric constant (low-k) dielectric film on a substrate. Furthermore, for example, the dielectric film can include a SiCOH-containing dielectric film.

According to one embodiment, a method of forming a damascene structure on a substrate is described. The method comprises preparing a film stack on the substrate, wherein the film stack comprises a SiCOH-containing layer formed on the substrate, a silicon oxide ($SiO_x$) layer formed on the SiCOH-containing layer, and a first mask layer formed on the silicon oxide layer. A trench pattern is created in the first mask layer. Thereafter, the trench pattern in the first mask layer is transferred to the silicon oxide layer, and then the first mask layer is removed. Following the removal of the first mask layer, a second mask layer is formed on the silicon oxide layer. A via pattern is formed in the second mask layer. Thereafter, the via pattern is transferred to the SiCOH-containing layer using a first etching process, and then the second mask layer is removed. Following the removal of the second mask layer, the trench pattern in the silicon oxide layer is transferred to the SiCOH-containing layer using a second etching process with plasma formed from a process composition comprising $NF_3$.

According to another embodiment, a dual damascene structure on a substrate is described. The structure comprises a silicon oxide ($SiO_x$) layer having a trench pattern formed therein; and a SiCOH-containing layer underlying the silicon oxide layer having the trench pattern formed partially therein and a via pattern formed there through.

DETAILED DESCRIPTION OF EXEMPLARY EMBODIMENTS

In the following description, for purposes of explanation and not limitation, specific details are set forth, such as particular processes and patterning systems. However, it should be understood that the invention may be practiced in other embodiments that depart from these specific details.

According to one embodiment, a method of forming a damascene structure on a substrate is described. The method comprises preparing a film stack on the substrate, wherein the film stack comprises a SiCOH-containing layer formed on the substrate, a silicon oxide ($SiO_x$) layer formed on the SiCOH-containing layer, and a first mask layer formed on the silicon oxide layer. A trench pattern is created in the first mask layer. Thereafter, the trench pattern in the first mask layer is transferred to the silicon oxide layer, and then the first mask layer is removed. Following the removal of the first mask layer, a second mask layer is formed on the silicon oxide layer. A via pattern is formed in the second mask layer. Thereafter, the via pattern is transferred to the SiCOH-containing layer using a first etching process, and then the second mask layer is removed. Following the removal of the second mask layer, the trench pattern in the silicon oxide layer is transferred to the SiCOH-containing layer using a second etching process with plasma formed from a process composition comprising $NF_3$.

Figure 3:
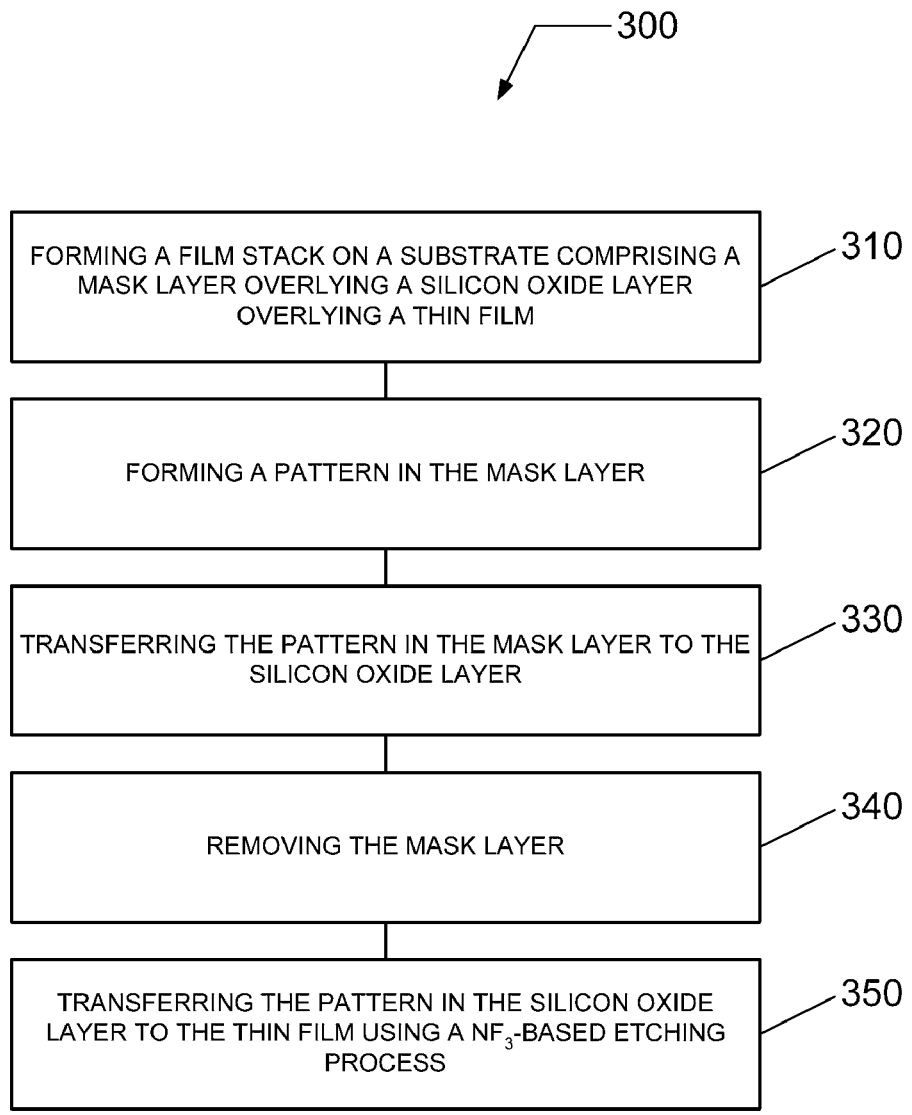
FIG. 3 illustrates a flow chart of a method for patterning a thin film on a substrate according to another embodiment.

According to another embodiment, a method of patterning a structure on a substrate is schematically illustrated in FIGS. 1A through 1D, and is illustrated in a flow chart 300 in FIG. 3. For example, the structure may include a trench, a via, or a contact. The method begins in 310 with forming a film stack 1 on a substrate 2. The film stack 1 comprises a thin film 3 formed on the substrate 2, a silicon oxide layer 4 formed on the thin film 3, and a mask layer 5 formed on the silicon oxide layer 4. The silicon oxide layer 4 may be silicon dioxide ($SiO_2$), or more generally $SiO_x$. Additionally, the film stack may include additional layers.

The thin film 3 comprises a dielectric layer that may include a material layer, or plurality of material layers, having silicon (Si), carbon (C), oxygen (O), and hydrogen (H). For instance, the thin film 3 may comprise a low dielectric constant (i.e., low-k) or ultra-low dielectric constant (i.e., ultra-low-k) dielectric layer having Si, C, O, and H, wherein a nominal dielectric constant value of the thin film 3 is less than the dielectric constant of $SiO_2$, which is approximately 4 (e.g., the dielectric constant for thermal silicon oxide can range from 3.8 to 3.9). More specifically, the thin film 3 may have a dielectric constant of less than 3.7, or a dielectric constant ranging from 1.6 to 3.7. The thin film 3 may be non-porous or porous.

The thin film 3 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The silicon oxide ($SiO_x$) layer can be formed using a vapor deposition technique, or a spin-on technique, or any other technique known to those skilled in the art of silicon oxide film formation.

The mask layer 5 can include one or more layers. For example, the mask layer 5 can comprise a layer of radiation-sensitive material, such as light-sensitive material, overlying an anti-reflective coating (ARC) layer. Additionally, for example, the mask layer 5 can comprise a layer of radiation-sensitive material overlying an anti-reflective coating (ARC) layer, which is overlying an optional organic planarization layer (OPL). Alternatively, the mask layer 5 can include a bilayer mask, or multilayer mask, having an anti-reflective coating (ARC), such as a buried ARC (BARC) layer, a sacrificial DUO™ layer, or a tunable etch resistant ARC (TERA) layer, embedded therein.

The layer of radiation-sensitive material can comprise photoresist. For example, photoresist may include 248 nm (nanometer) resists, 193 nm resists, 157 nm resists, EUV (extreme ultraviolet) resists, or electron sensitive resists. The photoresist layer may be formed using spin-on techniques.

The ARC layer possesses material properties suitable for use as an anti-reflective coating. Additionally, the ARC layer is selected to be compatible with the overlying photoresist layer and the lithographic wavelength, i.e., ArF, KrF, etc. The ARC layer may be formed using vapor deposition techniques or spin-on techniques.

The optional OPL may include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

One or more of the layers serving as mask layer 5 can be formed using a track system. For example, the track system may comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology. The coating of the photoresist layer may include any or all processes known to those skilled in the art of preparing such films including, but not limited to, performing a cleaning process prior to the coating process, performing a post-application bake (PAB) following the coating process, etc.

Figure 1A:
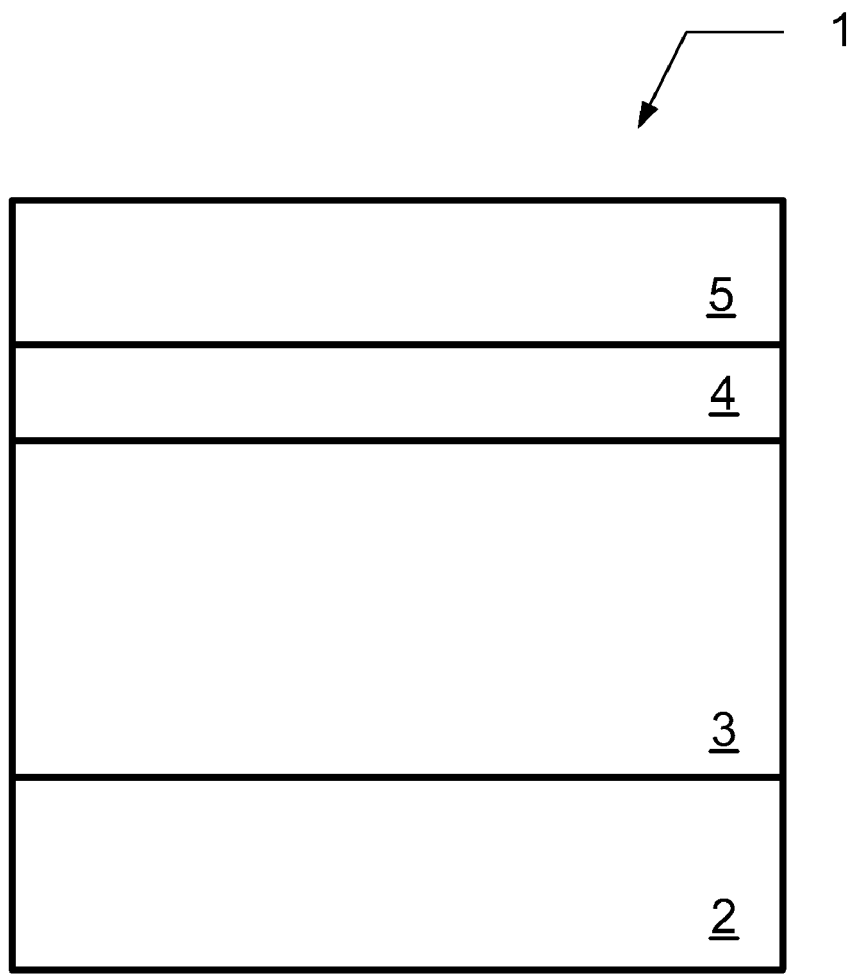
FIGS. 1A through 1D illustrate schematically a method for patterning a thin film on a substrate according to an embodiment.
Figure 1B:
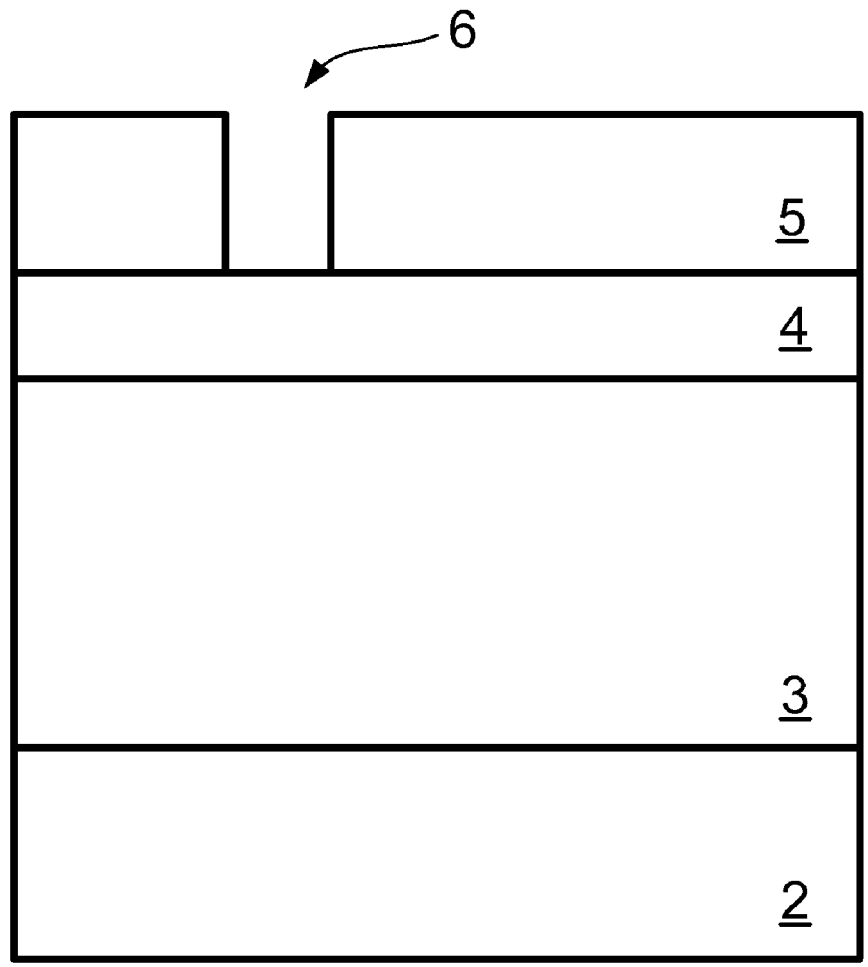

In 320 and as shown in FIG. 1B, a mask pattern 6 is formed in the mask layer 5. For example, the mask layer 5 may be imaged with an image pattern, and thereafter developed. The image pattern may comprise a via or contact pattern, or a trench pattern. The exposure to EM (electromagnetic) radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). If mask layer 5 includes additional layers, such as an ARC layer, then mask pattern 6 can be transferred to these layers using dry development techniques and/or wet development techniques known to those skilled in the art of bilayer, trilayer, etc., mask development.

Figure 1C:
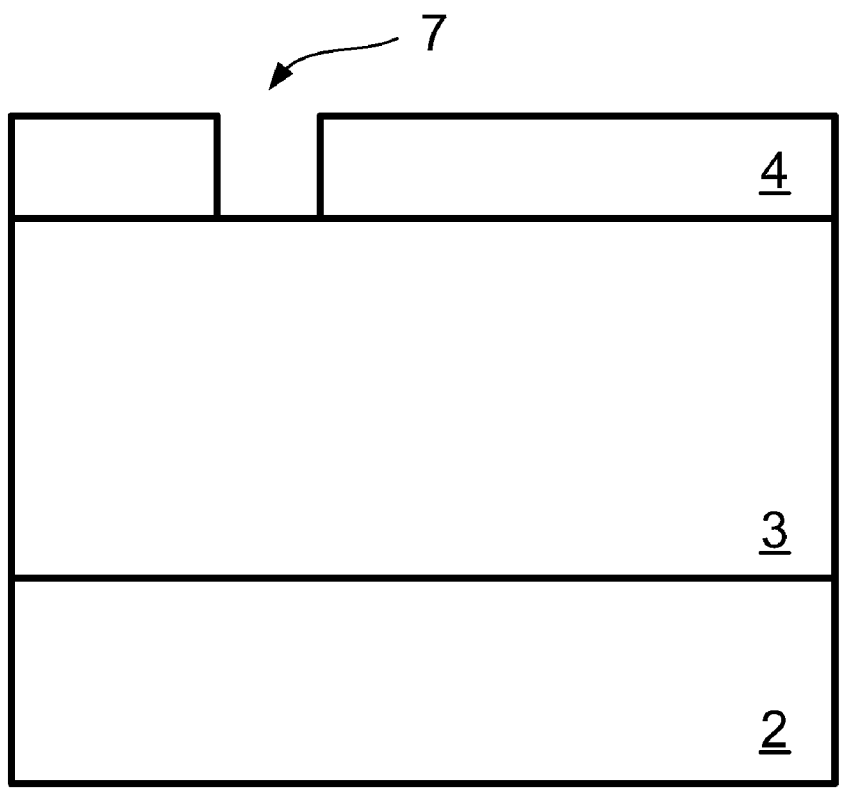

Thereafter, in 330 and as shown in FIG. 1C, the mask pattern 6 formed in mask layer 5 is transferred to the silicon oxide layer 4 to form a hard mask pattern 7. The transfer of mask pattern 6 can be accomplished using an etching process, such as a dry etching process or a wet etching process. The etching process may include a dry plasma or dry non-plasma etching process. When utilizing a dry plasma etching process for a silicon oxide film, the plasma etch gas composition may include a fluorocarbon-based chemistry such as at least one of $C_4F_8$, $C_5F_8$, $C_3F_6$, $C_4F_6$, $CF_4$, or more generally $C_xF_y$ (where x and y are integers greater than or equal to unity), or a fluorohydrocarbon-based chemistry such as at least one of $CHF_3$, $CH_2F_2$, or more generally $C_xF_yH_z$ (where x, y and z are integers greater than or equal to unity), or a combination of two or more thereof. Furthermore, additive gases may include an inert gas, such as a noble gas, oxygen, or CO, or two or more thereof. Alternatively, as would be understood by one skilled in the art of silicon oxide etching, any etching process chemistry can be employed that selectively etches the silicon oxide layer 4 relative to the mask layer 5.

In 340 and as shown in FIG. 1C, following the transfer of mask pattern 6 to the silicon oxide layer 4, the mask layer 5 is removed. The mask layer 5 can be removed using a wet or dry stripping/ashing process prior to transferring hard mask pattern 7 in silicon oxide layer 4 to the underlying thin film 3. As one advantage, for instance, the removal of the mask layer 5 prior to etching the thin film 3 may be simpler, due to the lack of hardened crusts resultant from etching of the thin film 3. Additionally, for instance, the removal of the mask layer 5 prior to etching of the thin film 3 minimizes the exposure of thin film 3 to a wet clean process when applying strip chemicals during a wet stripping process, or an ashing process when using an oxidizing plasma to remove photoresist and post-etch residue. For example, advanced (porous or non-porous) SiCOH-containing dielectric materials can be damaged when exposed to these etching, stripping and/or ashing processes, and thus, prior removal of the mask layer 5 can minimize damage of the thin film 3.

Figure 1D:
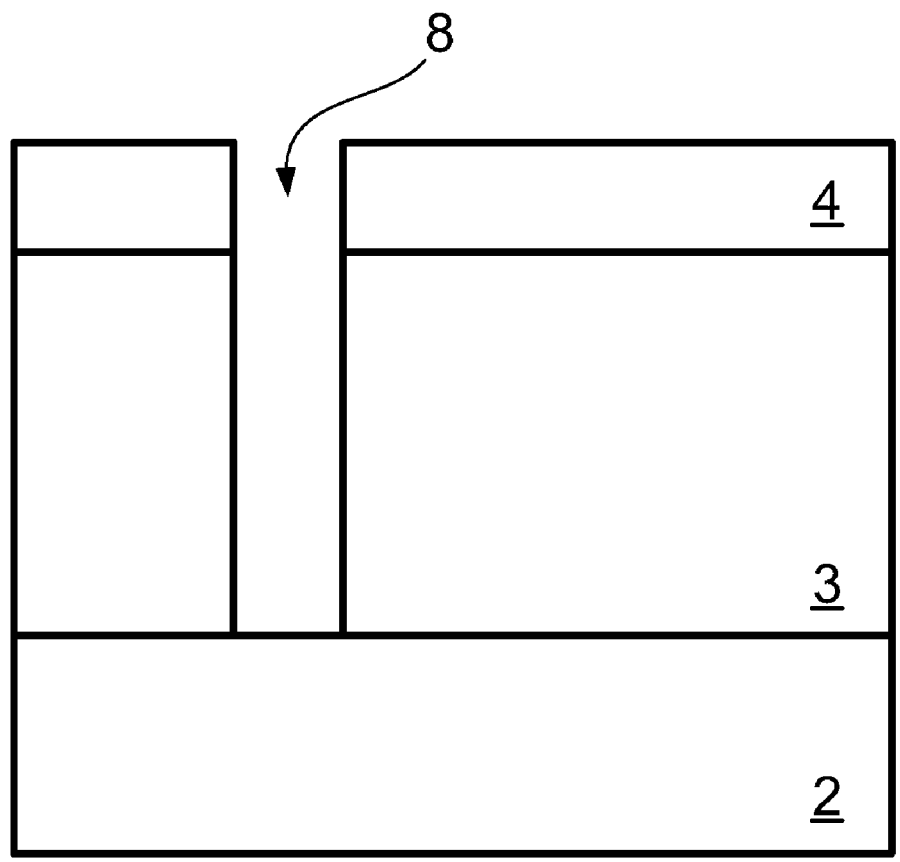

In 350 and as shown in FIG. 1D, following the removal of mask layer 5, the hard mask pattern 7 formed in silicon oxide layer 4 is transferred to the underlying thin film 3 using a dry plasma etching process to form a pattern 8 in thin film 3. According to one embodiment, the dry plasma etching process for transferring hard mask pattern 7 from the silicon oxide layer 4 to the underlying thin film 3 comprises introducing a process composition comprising $NF_3$ and an optional additive gas, and forming plasma from the process composition. The additive gas may serve as a dilution gas and/or a passivation gas. Thus, the etching process can provide improvements in the etch selectivity between a SiCOH-containing layer and those materials where etching is not intended such as $SiO_2$, for example.

The additive gas may comprise an oxygen containing gas, a nitrogen containing gas, a fluorocarbon gas (characterized by $C_xF_y$, wherein x and y are integers greater than or equal to unity), a hydrofluorocarbon gas (characterized by $C_xF_yH_z$ wherein x, y and z are integers greater than or equal to unity), or a hydrocarbon gas (characterized by $C_xH_y$, wherein x and y are integers greater than or equal to unity), or a combination of two or more thereof. For example, the oxygen containing gas may comprise $O_2$, NO, $NO_2$, $N_2O$, CO, or $CO_2$, or a combination of two or more thereof. Additionally, for example, the nitrogen containing gas may comprise $N_2$, or $NH_3$, or both. Additionally, the fluorocarbon gas may comprise $C_4F_8$, $C_5F_8$, $C_3F_6$, $C_4F_6$, or $CF_4$, or two or more thereof. Additionally, the hydrofluorocarbon gas may comprise $CHF_3$, or $CH_2F_2$, or both. Furthermore, the hydrocarbon gas may comprise $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or two or more thereof. The process composition may further include an inert gas, such as a noble gas (e.g., He, Ne, Ar, Kr, Xe).

Figure 4:
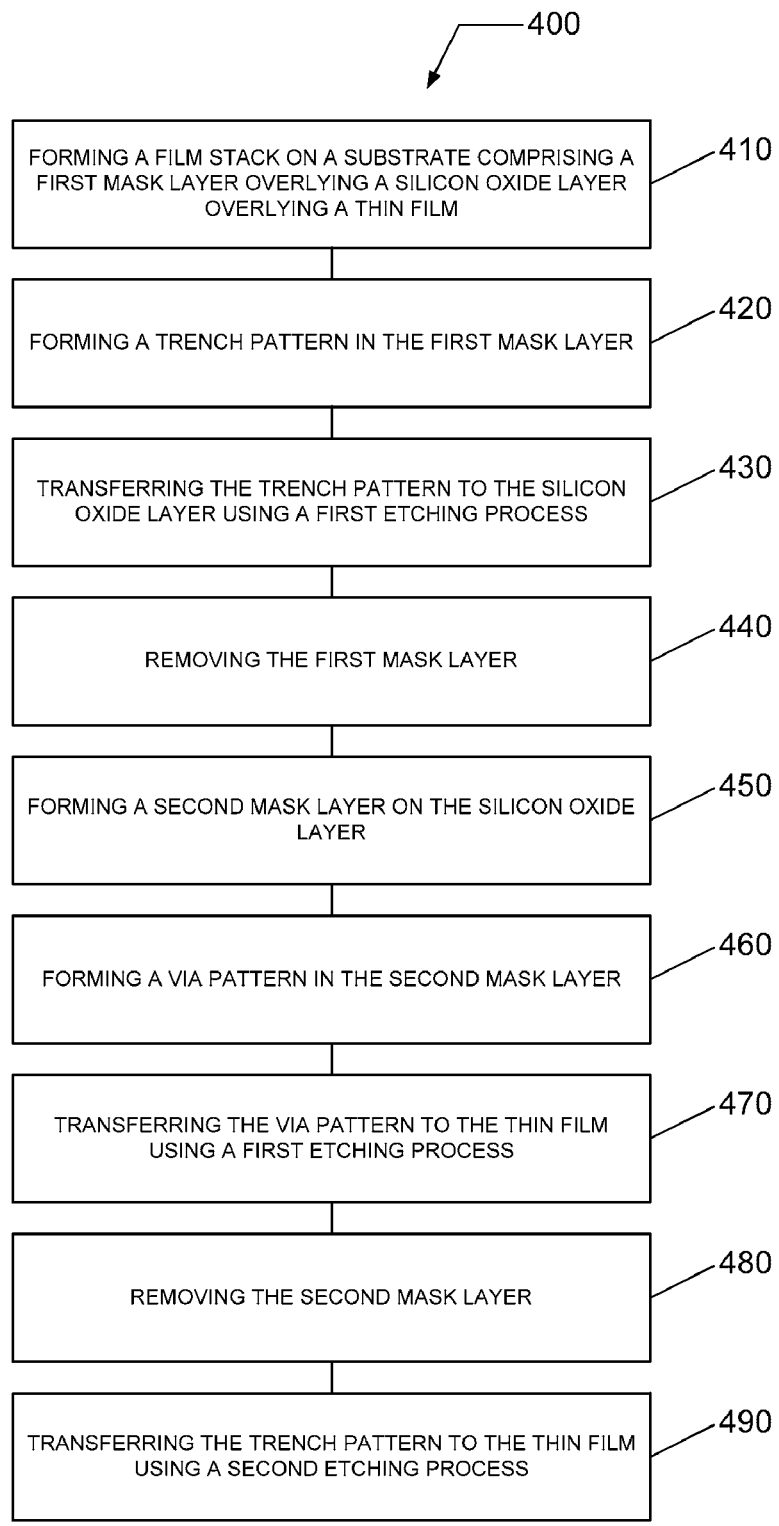
FIG. 4 illustrates a flow chart of a method for forming a trench-via structure on a substrate according to another embodiment.

According to another embodiment, a method of patterning a structure on a substrate is schematically illustrated in FIGS. 2A through 2H, and is illustrated in a flow chart 400 in FIG. 4. For example, the structure comprises a trench-via structure or damascene structure for making contact with a metal line 112. The method begins in 410 with forming a film stack 100 on a substrate 110. The film stack 100 comprises an optional etch stop layer 115 formed on substrate 110, a thin film 120 formed on the optional etch stop layer 115, a silicon oxide layer 140 formed on the thin film 120, and a first mask layer 150 formed on the silicon oxide layer 140. The silicon oxide layer 140 may be silicon dioxide ($SiO_2$), or more generally $SiO_x$. Additionally, the film stack may include additional layers. For example, one or more layers may be placed above or below the thin film 120. Additionally, for example, a metal hard mask may be placed above the thin film 120.

The optional etch stop layer 115 may include silicon nitride ($Si_xN_y$), silicon carbide ($Si_xC_y$), silicon carbonitride ($SiC_xN_y$), or $SiC_xN_yH_z$, such as NBLoK™.

The thin film 120 comprises a dielectric layer that may include a material layer, or plurality of material layers, having Si, C, O, and H. For instance, the thin film 120 may comprise a low-k or ultra-low-k dielectric layer having Si, C, O, and H.

The thin film 120 may be formed using a vapor deposition technique, such as CVD, PECVD, ALD, PEALD, PVD, or iPVD, or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system may be configured for processing substrate sizes of 100 mm, 200 mm, 300 mm, and greater. Other systems and methods for forming a thin film on a substrate are well known to those skilled in the art of both spin-on technology and vapor deposition technology.

The first mask layer 150 may include one or more layers. For example, the first mask layer 150 may comprise a layer of radiation-sensitive material, such as a light-sensitive material, overlying an ARC layer. Additionally, for example, the first mask layer 150 may comprise a layer of radiation-sensitive material overlying an ARC layer, which is overlying an optional OPL. Alternatively, the first mask layer 150 may include a bilayer mask, or multilayer mask, having an ARC, such as a BARC layer, a sacrificial DUO™ layer, or a TERA layer, embedded therein.

The layer of radiation-sensitive material may comprise photoresist. For example, photoresist may include 248 nm resists, 193 nm resists, 157 nm resists, EUV resists, or electron sensitive resists. The photoresist layer may be formed using spin-on techniques.

The ARC layer possesses material properties suitable for use as an anti-reflective coating. Additionally, the ARC layer is selected to be compatible with the overlying photoresist layer and the lithographic wavelength, i.e., ArF, KrF, etc. The ARC layer may be formed using vapor deposition techniques or spin-on techniques.

The optional OPL may include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

One or more of the layers serving as first mask layer 150 may be formed using a track system. For example, the track system may comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology. The coating of the photoresist layer may include any or all processes known to those skilled in the art of preparing such films including, but not limited to, performing a cleaning process prior to the coating process, performing a post-application bake (PAB) following the coating process, etc.

In addition to the silicon oxide layer 140, film stack 100 may include one or more additional material layers including a metal-containing layer, such as titanium (Ti), titanium nitride ($Ti_xN_y$), tantalum (Ta), tantalum nitride ($Ta_xN_y$), aluminum (Al), or aluminum-copper alloy (Al—Cu), or a dielectric material, such as silicon carbide ($Si_xC_y$), silicon nitride ($Si_xN_y$), or silicon oxynitride ($Si_xO_yN_z$), or amorphous carbon (a-C). Furthermore, the silicon oxide layer 140 may be replaced by any one or more of these material layers. For example, the silicon oxide layer 140 may optionally include an overlying metal hard mask layer and/or an underlying hard mask layer.

Figure 2A:
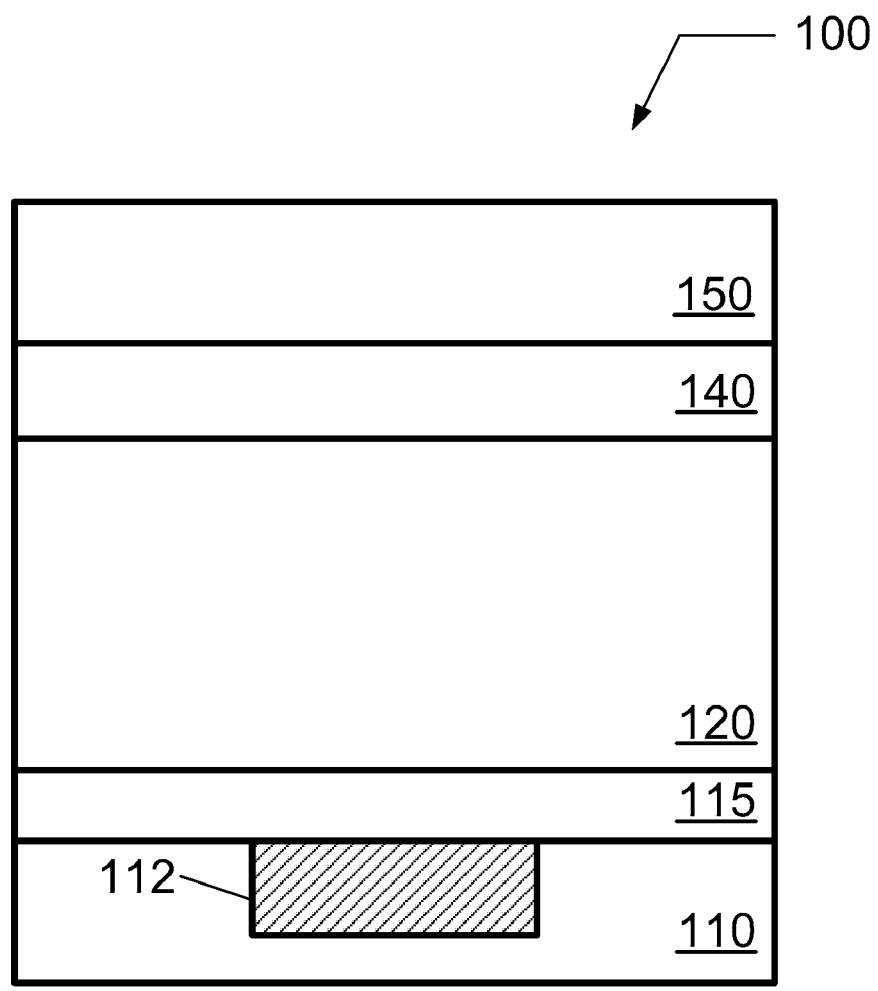
FIGS. 2A through 2H illustrate schematically a method for forming a trench-via structure on a substrate according to another embodiment.
Figure 2B:
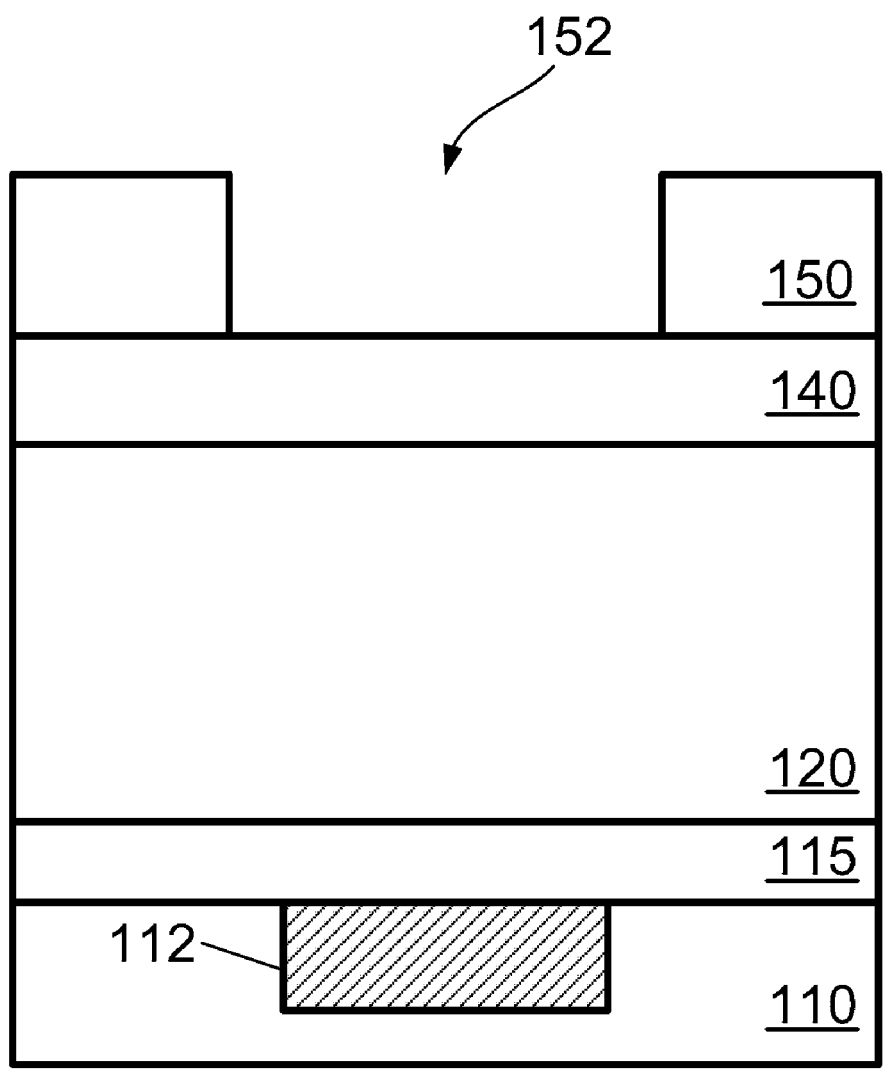

In 420 and as shown in FIG. 2B, a trench image pattern 152 is formed in the first mask layer 150. For example, the first mask layer 150 may be imaged with an image pattern, and thereafter developed. The exposure to EM radiation through a reticle is performed in a dry or wet photo-lithography system. The image pattern may be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). If the first mask layer 150 includes additional layers, such as an ARC layer, then trench image pattern 152 can be transferred to these layers using dry development techniques and/or wet development techniques known to those skilled in the art of bilayer, trilayer, etc., mask development.

Figure 2C:
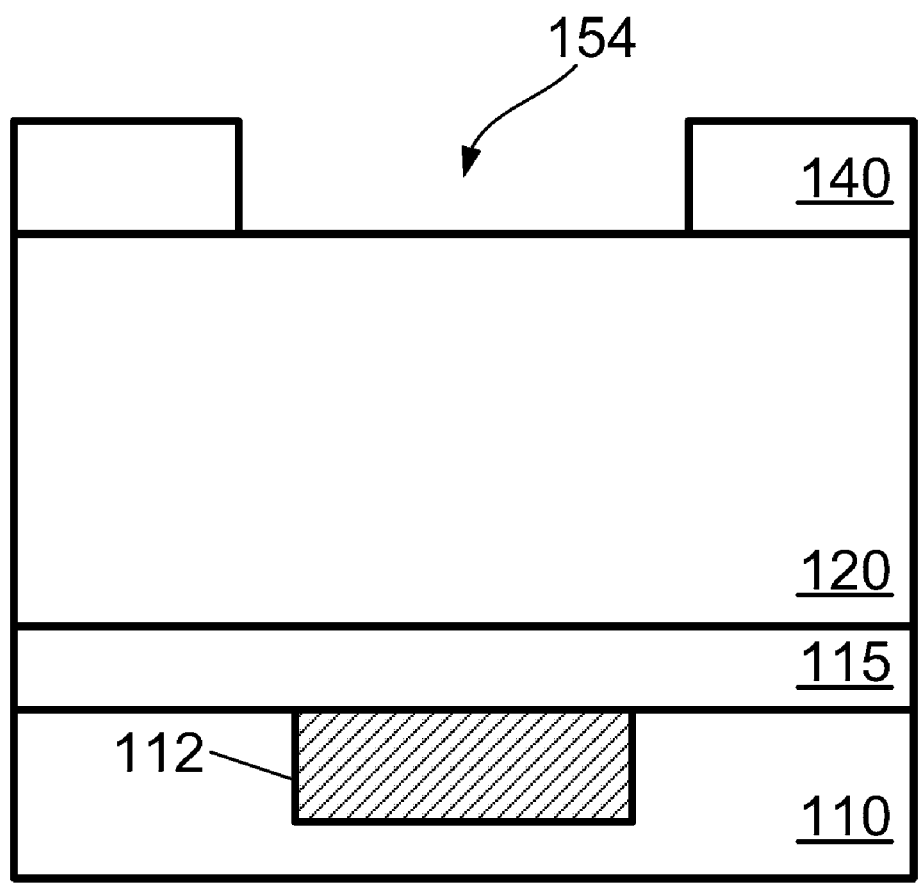

Thereafter, in 430 and as shown in FIG. 2C, the trench image pattern 152 formed in first mask layer 150 is transferred to the silicon oxide layer 140 to form trench pattern 154. The formation of trench pattern 154 can be accomplished using an etching process, such as a dry etching process or a wet etching process. The etching process may include a dry plasma etching process or dry non-plasma etching process. When utilizing a dry plasma etching process for a silicon oxide film, the plasma etch gas composition may include a fluorocarbon-based chemistry such as at least one of $C_4F_8$, $C_5F_8$, $C_3F_6$, $C_4F_6$, $CF_4$, etc., or a fluorohydrocarbon-based chemistry such as at least one of $CHF_3$, $CH_2F_2$, etc., or a combination of two or more thereof. Furthermore, additive gases may include an inert gas, such as a noble gas, oxygen, or CO, or two or more thereof. Alternatively, as would be understood by one skilled in the art of silicon oxide etching, any etching process chemistry can be employed that selectively etches the silicon oxide layer 140 relative to the first mask layer 150.

In 440 and as shown in FIG. 2C, following the transfer of trench image pattern 152 to the silicon oxide layer 140, the first mask layer 150 is removed. The first mask layer 150 can be removed using a wet or dry stripping/ashing process.

Figure 2D:
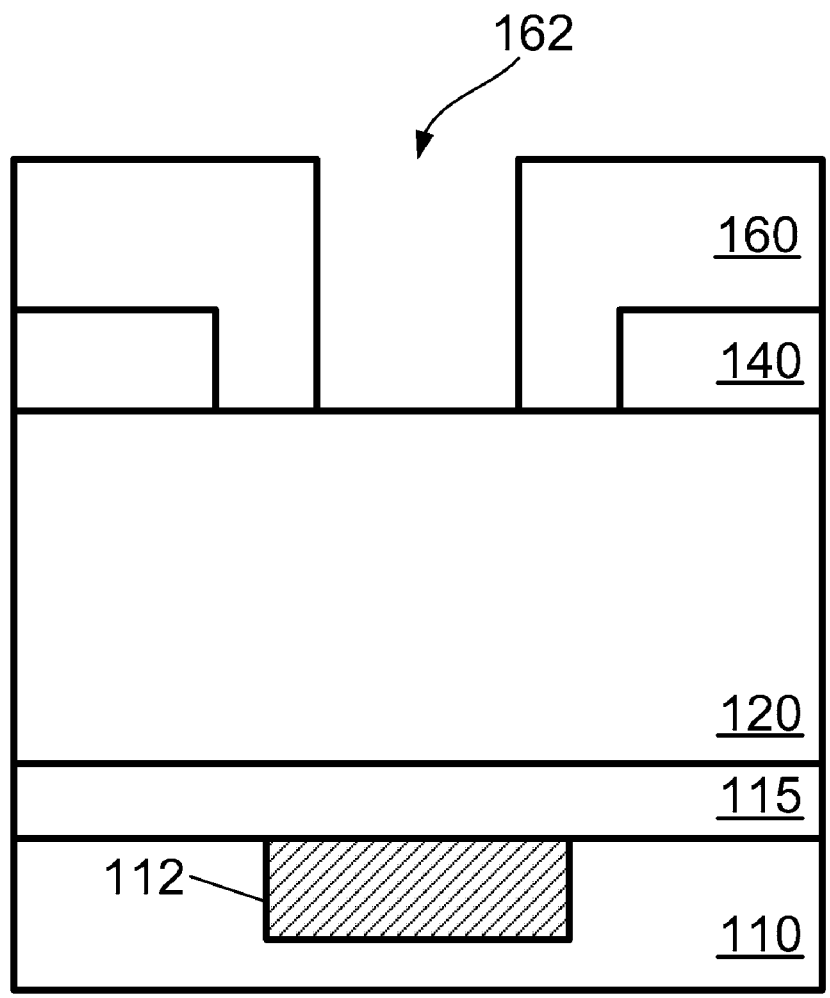

In 450 and as shown in FIG. 2D, a second mask layer 160 is formed on film stack 100. Thereafter, in 460, a via (or contact) image pattern 162 is formed and aligned with the trench pattern 154 in the silicon oxide layer 140.

Figure 2E:
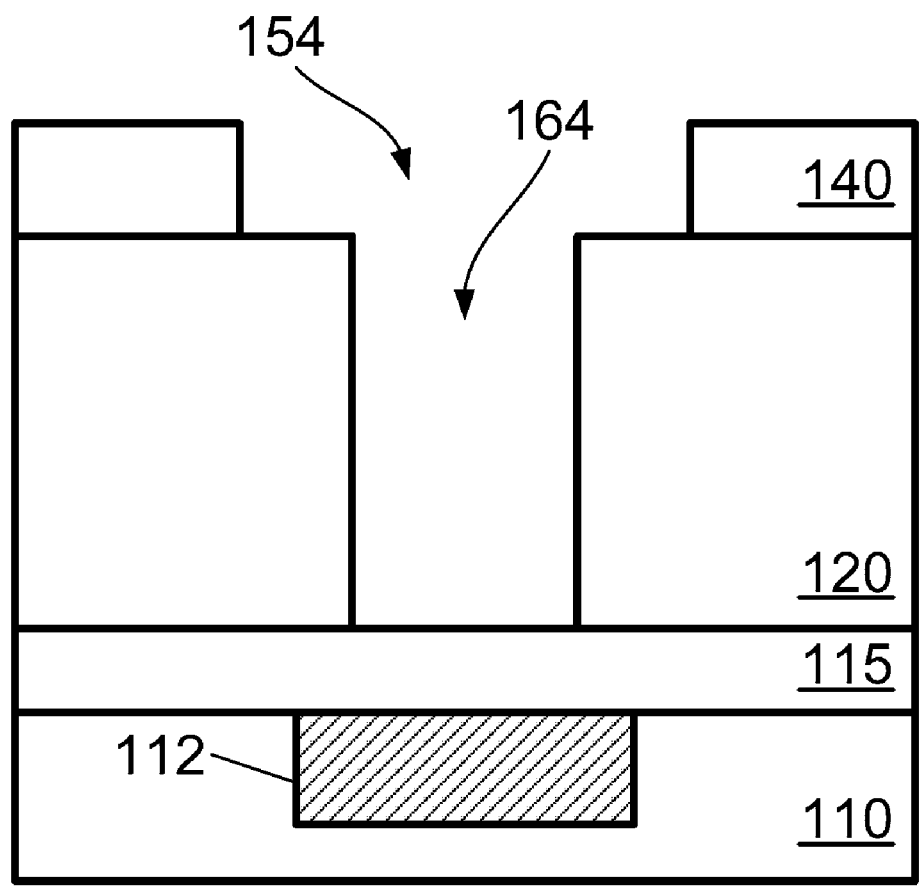
Figure 2F:
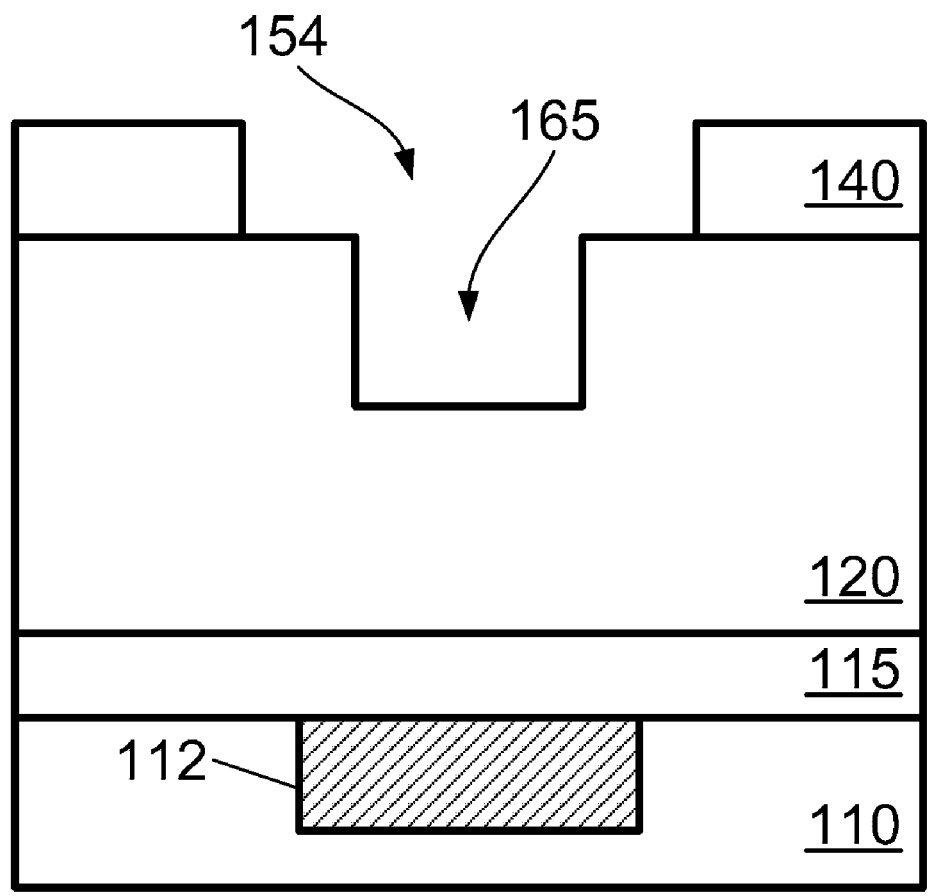

In 470 and as shown in FIG. 2E, the via image pattern 162 is transferred to the thin film 120 using a first etching process to form via pattern 164. According to one embodiment, as shown in FIG. 2E, the via pattern 164 may be fully completed in the thin film 120, e.g., the via pattern 164 extends through the full thickness of thin film 120. The first etching process for transferring the via pattern can stop on the optional etch stop layer 115. Alternatively, according to another embodiment, as shown in FIG. 2F, a partial via pattern 165 may be partially transferred to the thin film 120, e.g., the partial via pattern 165 extends to only a fraction of the full thickness of thin film 120. In either embodiment, the first etching process may comprise a conventional etch process for SiCOH-containing materials as would be understood by one skilled in the art of low-k dielectric etching, or the $NF_3$-based process chemistry described above and below.

Thereafter, in 480 and as shown in FIGS. 2E and 2F, the second mask layer 160 is removed. The second mask layer 160 can be removed using a wet or dry stripping/ashing process prior to transferring trench pattern 154 in silicon oxide layer 140 to the thin film 120. As one advantage, for instance, the removal of the second mask layer 160 prior to etching the thin film 120 may be simpler, due to the lack of hardened crusts resultant from etching of the thin film 120. Additionally, for instance, the removal of the second mask layer 160 prior to etching of the thin film 120 minimizes the exposure of thin film 120 to a wet clean process when applying strip chemicals during a wet stripping process, or an ashing process when using an oxidizing plasma to remove photoresist and post-etch residue. For example, advanced (porous or non-porous) SiCOH-containing dielectric materials can be damaged when exposed to these etching, stripping and/or ashing processes, and thus, prior removal of the second mask layer 160 can minimize damage of the thin film 120.

Figure 2G:
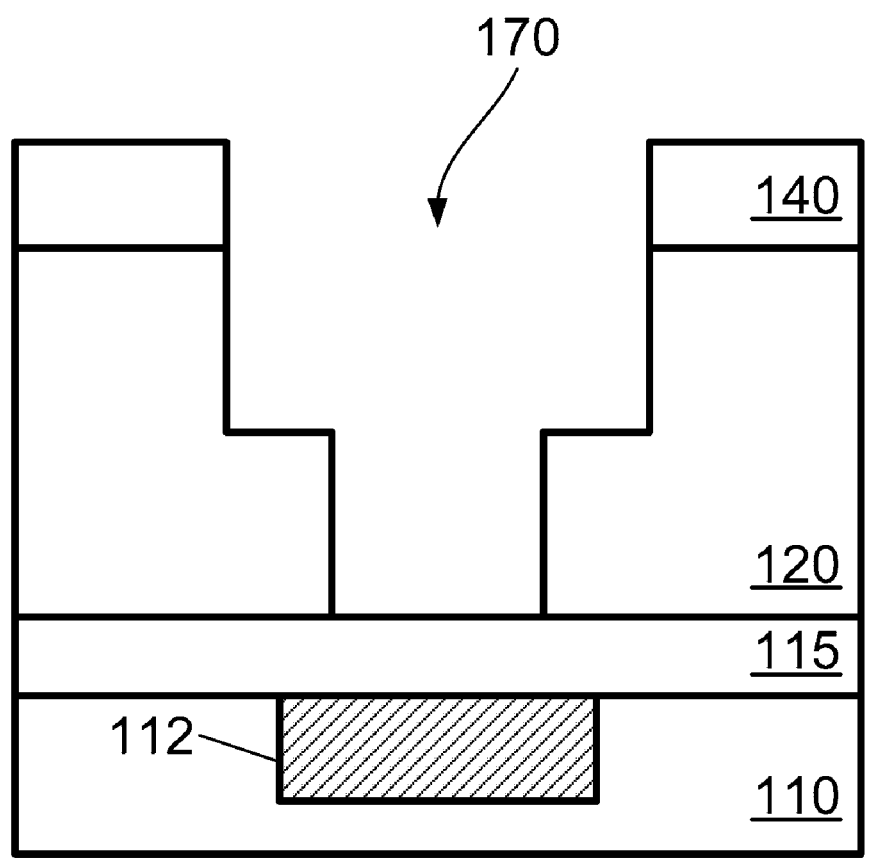

In 490 and as shown in FIG. 2G, following the removal of second mask layer 160, the trench pattern 154 formed in silicon oxide layer 140 is transferred to the thin film 120 using a second etching process, such as a dry plasma etching process, to form a trench-via structure 170. During the second etching process to transfer the trench pattern 154, the partial via pattern 165 can be completed in the thin film 120 and the second etching process can stop on the optional etch stop layer 115. According to one embodiment, the second etching process for transferring trench pattern 154 from the silicon oxide layer 140 to the thin film 120 comprises introducing a process composition comprising $NF_3$ and an optional additive gas, and forming plasma from the process composition. The additive gas may serve as a dilution gas and/or a passivation gas. Thus, the second etching process can provide improvements in the etch selectivity between a SiCOH-containing layer and those materials where etching is not intended such as $SiO_2$, for example.

The additive gas may comprise an oxygen containing gas, a nitrogen containing gas, a fluorocarbon gas (characterized by $C_xF_y$, wherein x and y are integers greater than or equal to unity), a hydrofluorocarbon gas (characterized by $C_xF_yH_z$, wherein x, y and z are integers greater than or equal to unity), or a hydrocarbon gas (characterized by $C_xH_y$, wherein x and y are integers greater than or equal to unity), or a combination of two or more thereof. For example, the oxygen containing gas may comprise $O_2$, NO, $NO_2$, $N_2O$, CO, or $CO_2$, or a combination of two or more thereof. Additionally, for example, the nitrogen containing gas may comprise $N_2$, or $NH_3$, or both. Additionally, the fluorocarbon gas may comprise $C_4F_8$, $C_5F_8$, $C_3F_6$, $C_4F_6$, or $CF_4$, or two or more thereof. Additionally, the hydrofluorocarbon gas may comprise $CHF_3$, or $CH_2F_2$, or both. Furthermore, the hydrocarbon gas may comprise $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, or $C_6H_{12}$, or two or more thereof. The process composition may further include an inert gas, such as a noble gas (e.g., He, Ne, Ar, Kr, Xe).

Figure 2H:
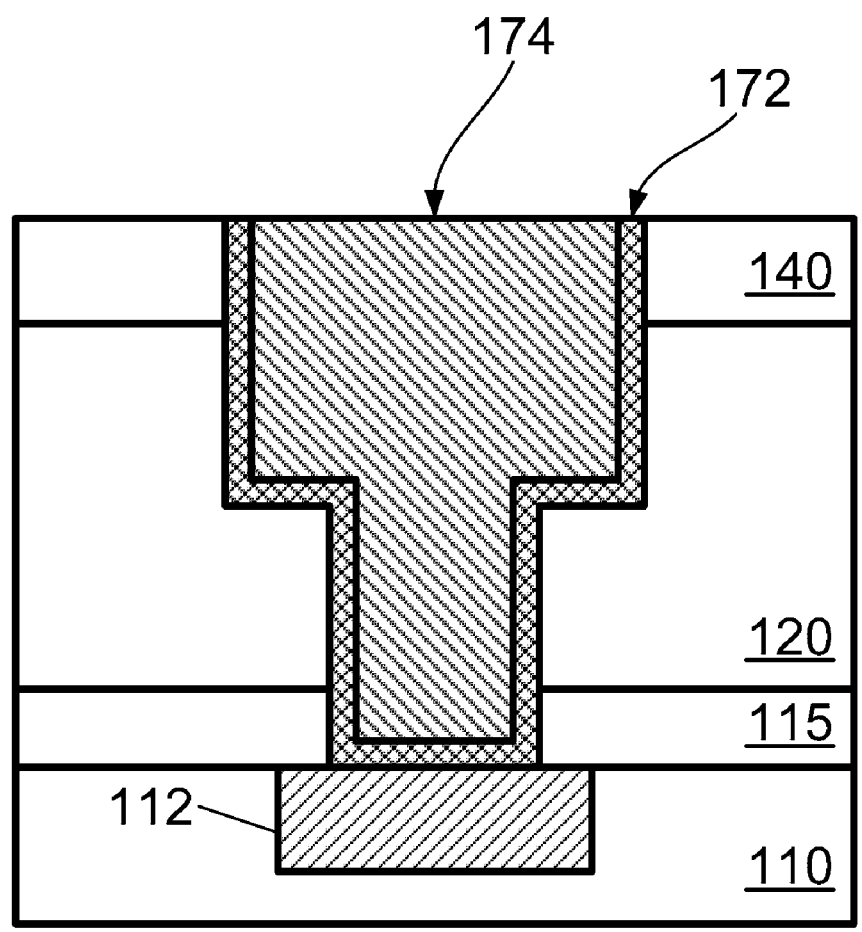

Thereafter, as shown in FIG. 2H, the via pattern 164 can be transferred to the optional etch stop layer 115. One or more barrier layers or seed layers 172 may be conformally deposited, and the trench-via structure 170 can be filled with metal and planarized to create a damascene (interconnect) structure 174. The silicon oxide layer 140 can act as a stop layer for the planarization process (such as a chemical-mechanical planarization (CMP) process).

Figure 5:
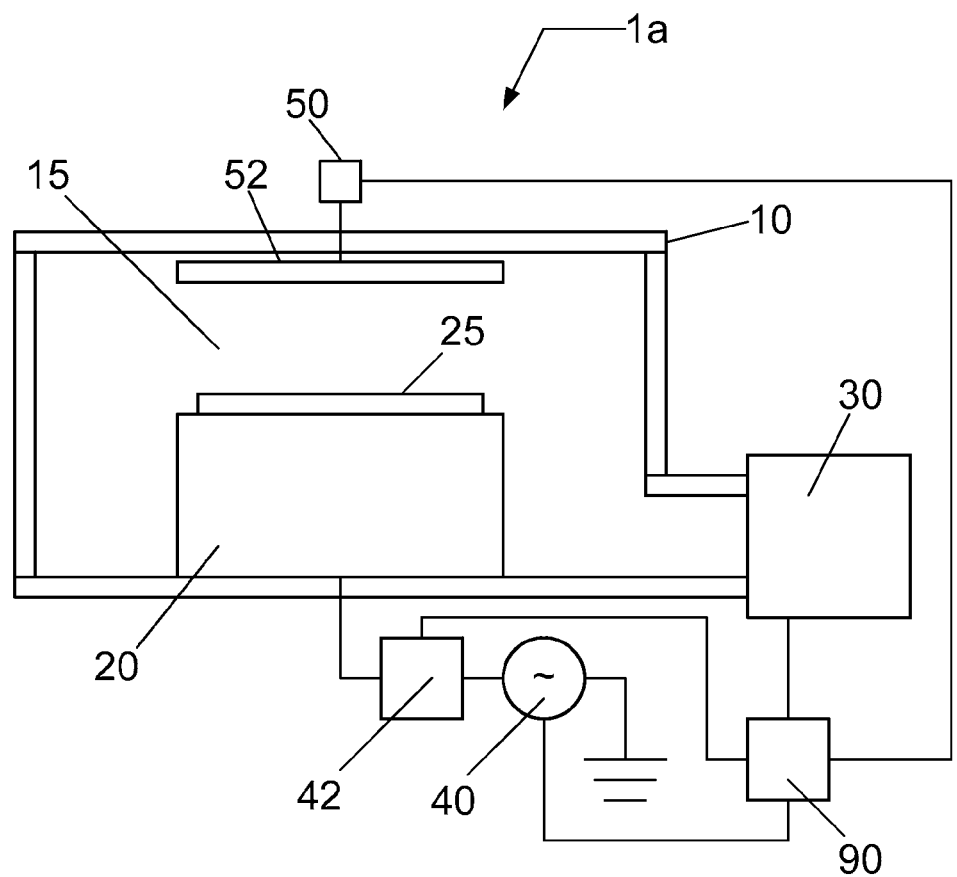
FIG. 5 shows a schematic representation of a processing system according to an embodiment.

FIG. 5 illustrates a plasma processing system according to an embodiment. Plasma processing system 1a comprises a plasma processing chamber 10, substrate holder 20, upon which a substrate 25 to be processed is affixed, and vacuum pumping system 30. Substrate 25 can be a semiconductor substrate, a wafer, or a liquid crystal display. Plasma processing chamber 10 can be configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process a substrate of any size, such as 200 mm substrates, 300 mm substrates, or larger.

Substrate 25 may be affixed to the substrate holder 20 via an electrostatic clamping system. Furthermore, substrate holder 20 can further include a temperature control system for controlling the temperature of substrate 25 during various etching processes.

The substrate holder 20 can comprise a temperature control system having a cooling system or a heating system or both. For instance, the cooling system or heating system can include a re-circulating fluid flow that receives heat from substrate holder 20 and transfers heat to a heat exchanger system (not shown) when cooling, or transfers heat from the heat exchanger system to the fluid flow when heating. Additionally, for instance, the cooling system or heating system may comprise heating/cooling elements, such as resistive heating elements, or thermo-electric heaters/coolers located within the substrate holder 20. For example, the substrate temperature may range from approximately 10 degrees C. to approximately 250 degrees, and can range from approximately 10 degrees C. to approximately 50 degrees C.

Moreover, the substrate holder 20 can facilitate the delivery of heat transfer gas to the back-side of substrate 25 via a backside gas supply system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 25.

In other embodiments, heating/cooling elements, such as resistive heating elements, or thermoelectric heaters/coolers can be included in the chamber wall of the plasma processing chamber 10 and any other component within the plasma processing system 1a.

In the embodiment shown in FIG. 5, substrate holder 20 can comprise an electrode through which RF power is coupled to the processing plasma in processing region 15. For example, substrate holder 20 can be electrically biased at a RF voltage via the transmission of RF power from a RF generator 40 through an optional impedance match network 42 to substrate holder 20. The RF bias can serve to heat electrons to form and maintain plasma, or affect the ion energy distribution function within the sheath, or both. In this configuration, the system can operate as a reactive ion etch (RIE) reactor, wherein the chamber can serve as ground surfaces. A typical frequency for the RF bias can range from 0.1 MHz to 100 MHz. RF systems for plasma processing are well known to those skilled in the art.

Furthermore, impedance match network 42 serves to improve the transfer of RF power to plasma in plasma processing chamber 10 by reducing the reflected power. Match network topologies (e.g. L-type, π-type, T-type, etc.) and automatic control methods are well known to those skilled in the art.

Referring still to FIG. 5, plasma processing system 1a optionally comprises a direct current (DC) power supply 50 coupled to an upper electrode 52 opposing substrate 25. The upper electrode 52 may comprise an electrode plate. The electrode plate may comprise a silicon-containing electrode plate. Moreover, the electrode plate may comprise a doped silicon electrode plate. The DC power supply 50 can include a variable DC power supply. Additionally, the DC power supply 50 can include a bipolar DC power supply. The DC power supply 50 can further include a system configured to perform at least one of monitoring adjusting, or controlling the polarity, current, voltage, or on/off state of the DC power supply 50. Once plasma is formed, the DC power supply 50 facilitates the formation of a ballistic electron beam (collision-less electron beam). An electrical filter may be utilized to de-couple RF power from the DC power supply 50.

For example, the DC voltage applied to upper electrode 52 by DC power supply 50 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 52. The surface of the upper electrode 52 facing the substrate holder 20 may be comprised of a silicon-containing material.

Vacuum pumping system 30 can include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP can be employed. TMPs can be used for low pressure processing, typically less than 50 mTorr. For high pressure processing (i.e., greater than 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Referring still to FIG. 5, plasma processing system 1a further comprises a controller 90 that comprises a microprocessor, memory, and a digital I/O port capable of generating control voltages sufficient to communicate and activate inputs to plasma processing system 1a as well as monitor outputs from plasma processing system 1a. Moreover, controller 90 can be coupled to and can exchange information with RF generator 40, impedance match network 42, optional DC power supply 50, the gas injection system (not shown), vacuum pumping system 30, as well as the backside gas delivery system (not shown), the substrate/substrate holder temperature control system (not shown), and/or the electrostatic clamping system (not shown). A program stored in the memory can be utilized to activate the inputs to the aforementioned components of plasma processing system 1a according to a process recipe in order to perform the method of etching a thin film. One example of controller 90 is a DELL PRECISION WORKSTATION 610™, available from Dell Corporation, Austin, Tex.

Controller 90 may be locally located relative to the plasma processing system 1a, or it may be remotely located relative to the plasma processing system 1a via an internet or intranet. Thus, controller 90 can exchange data with the plasma processing system 1a using at least one of a direct connection, an intranet, or the internet. Controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, or the internet.

Furthermore, embodiments of this invention may be used as or to support a software program executed upon some form of processing core (such as a processor of a computer, e.g., controller 90) or otherwise implemented or realized upon or within a machine-readable medium. A machine-readable medium includes any mechanism for storing information in a form readable by a machine (e.g., a computer). For example, a machine-readable medium can include such as a read only memory (ROM); a random access memory (RAM); a magnetic disk storage media; an optical storage media; and a flash memory device, etc.

Figure 6:
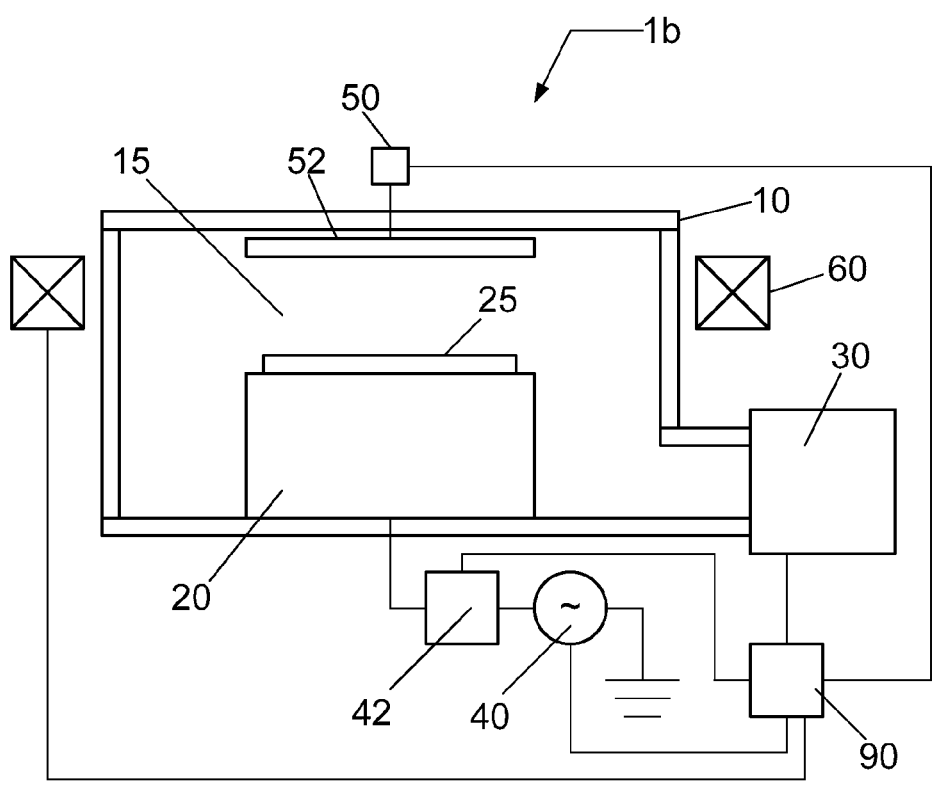
FIG. 6 shows a schematic representation of a processing system according to another embodiment.

In the embodiment shown in FIG. 6, a plasma processing system 1b can be similar to the embodiment of FIG. 5 and further comprise either a stationary, or mechanically or electrically rotating magnetic field system 60, in order to potentially increase plasma density and/or improve plasma processing uniformity. Moreover, controller 90 can be coupled to magnetic field system 60 in order to regulate the speed of rotation and field strength. The design and implementation of a rotating magnetic field is well known to those skilled in the art.

Figure 7:
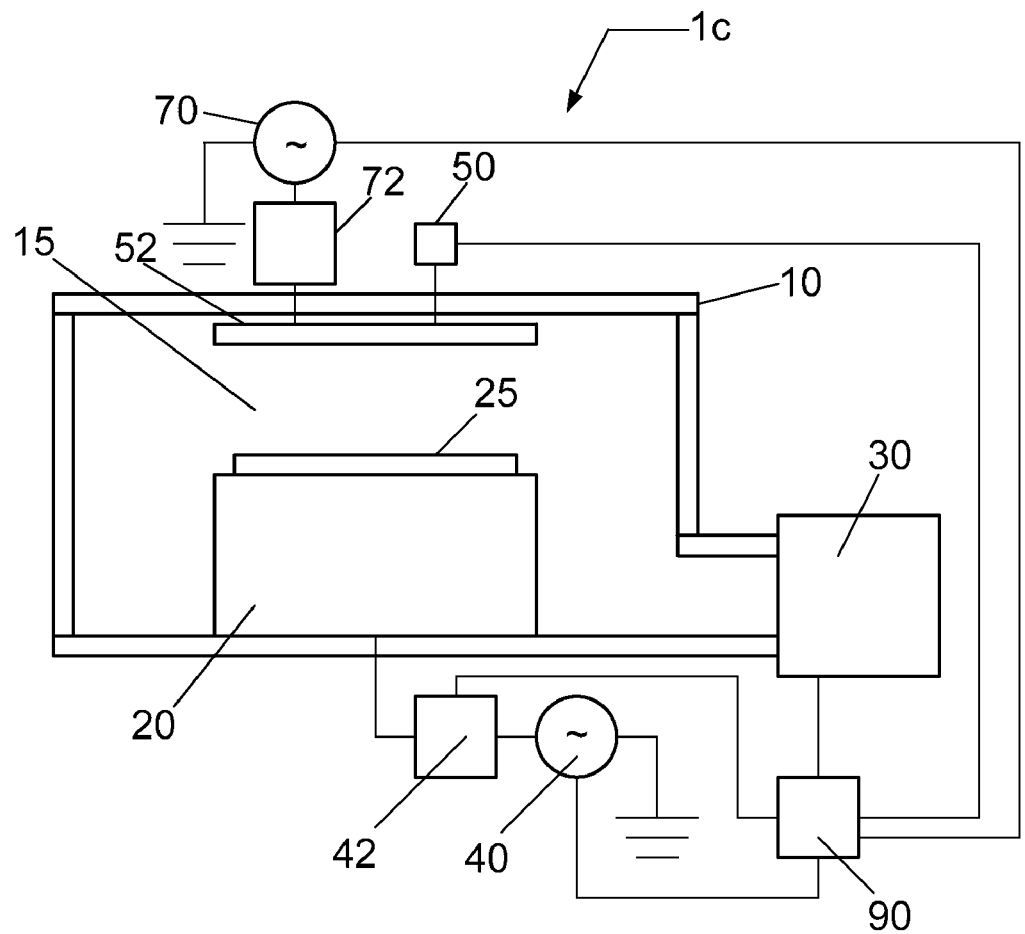
FIG. 7 shows a schematic representation of a processing system according to another embodiment.

In the embodiment shown in FIG. 7, a plasma processing system 1c can be similar to the embodiment of FIG. 5 or FIG. 6, and can further comprise a RF generator 70 configured to couple RF power to upper electrode 52 through an optional impedance match network 72. A typical frequency for the application of RF power to upper electrode 52 can range from about 0.1 MHz to about 200 MHz. Additionally, a typical frequency for the application of power to the substrate holder 20 (or lower electrode) can range from about 0.1 MHz to about 100 MHz. For example, the RF frequency coupled to the upper electrode 52 can be relatively higher than the RF frequency coupled to the substrate holder 20. Furthermore, the RF power to the upper electrode 52 from RF generator 70 can be amplitude modulated, or the RF power to the substrate holder 20 from RF generator 40 can be amplitude modulated, or both RF powers can be amplitude modulated. Desirably, the RF power at the higher RF frequency is amplitude modulated. Moreover, controller 90 is coupled to RF generator 70 and impedance match network 72 in order to control the application of RF power to upper electrode 52. The design and implementation of an upper electrode is well known to those skilled in the art.

Referring still to FIG. 7, the optional DC power supply 50 may be directly coupled to upper electrode 52, or it may be coupled to the RF transmission line extending from an output end of impedance match network 72 to upper electrode 52. An electrical filter may be utilized to de-couple RF power from DC power supply 50.

Figure 8:
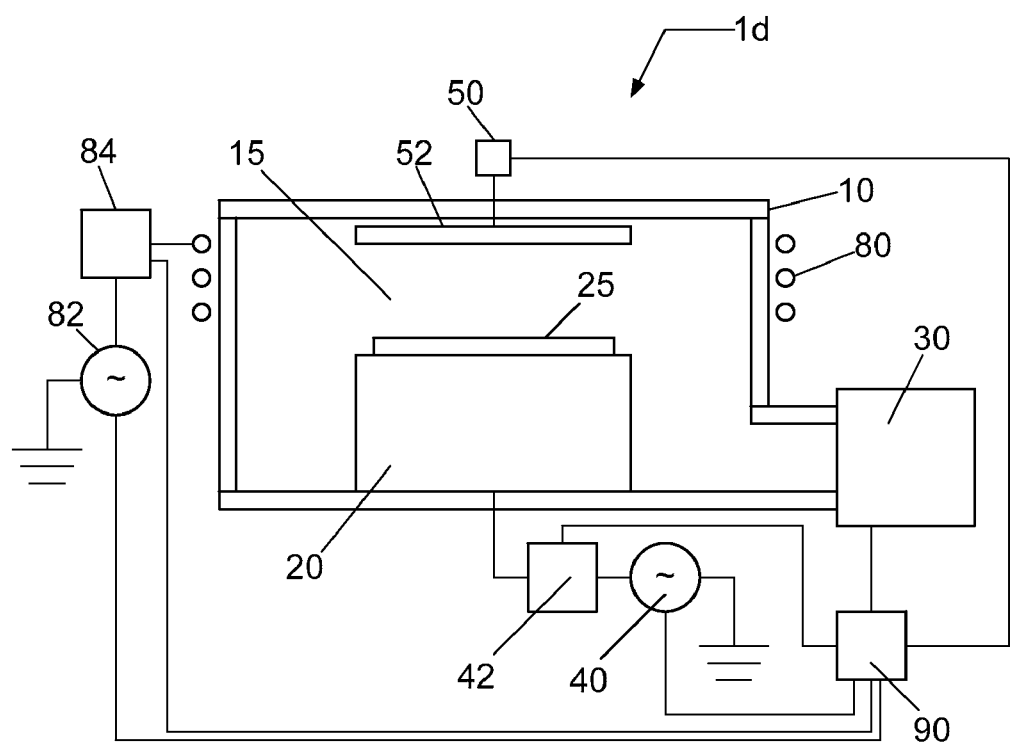
FIG. 8 shows a schematic representation of a processing system according to another embodiment.

In the embodiment shown in FIG. 8, a plasma processing system 1d can, for example, be similar to the embodiments of FIGS. 5, 6 and 7, and can further comprise an inductive coil 80 to which RF power is coupled via RF generator 82 through an optional impedance match network 84. RF power is inductively coupled from inductive coil 80 through a dielectric window (not shown) to plasma in processing region 15. A typical frequency for the application of RF power to the inductive coil 80 can range from about 10 MHz to about 100 MHz. Similarly, a typical frequency for the application of power to the substrate holder 20 (or lower electrode) can range from about 0.1 MHz to about 100 MHz. In addition, a slotted Faraday shield (not shown) can be employed to reduce capacitive coupling between the inductive coil 80 and plasma. Moreover, controller 90 is coupled to RF generator 82 and impedance match network 84 in order to control the application of power to inductive coil 80. In an alternate embodiment, inductive coil 80 can be a "spiral" coil or "pancake" coil in communication with the plasma in processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 9:
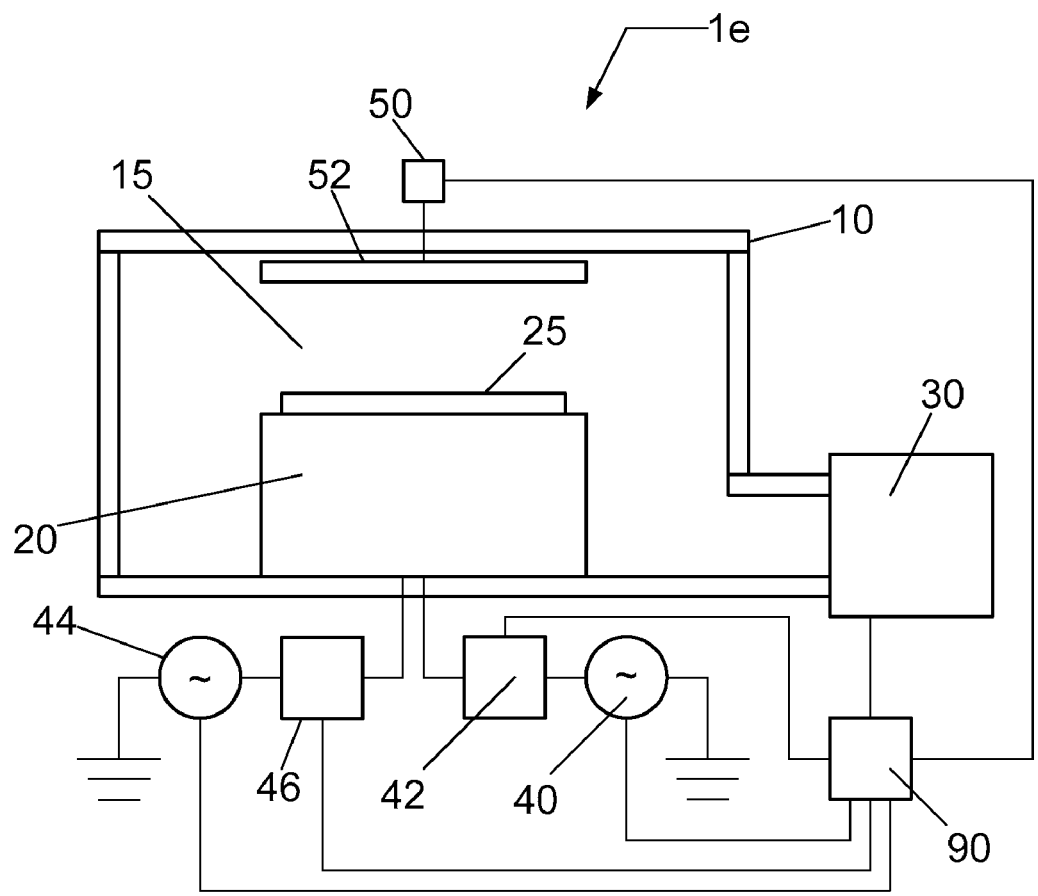
FIG. 9 shows a schematic representation of a processing system according to another embodiment.

In the embodiment shown in FIG. 9, a plasma processing system 1e can, for example, be similar to the embodiments of FIGS. 5, 6 and 7, and can further comprise a second RF generator 44 configured to couple RF power to substrate holder 20 through another optional impedance match network 46. A typical frequency for the application of RF power to substrate holder 20 can range from about 0.1 MHz to about 200 MHz for either the RF generator 40 or the second RF generator 44 or both. The RF frequency for the second RF generator 44 can be relatively greater than the RF frequency for the RF generator 44. Furthermore, the RF power to the substrate holder 20 from RF generator 40 can be amplitude modulated, or the RF power to the substrate holder 20 from RF generator 44 can be amplitude modulated, or both RF powers can be amplitude modulated. Desirably, the RF power at the higher RF frequency is amplitude modulated. Moreover, controller 90 is coupled to the second RF generator 44 and impedance match network 46 to control the application of RF power to substrate holder 20. The design and implementation of an RF system for a substrate holder is well known to those skilled in the art.

In the following discussion, a method of etching a SiCOH-containing layer utilizing a plasma processing system is presented. For example, the plasma processing system can comprise various elements, such as described in FIGS. 5 through 9, and combinations thereof.

In one example, a process parameter space for etching a SiCOH-containing layer can comprise a chamber pressure of about 5 to about 1000 mTorr, a $NF_3$ process gas flow rate ranging from about 1 to about 500 sccm, an optional additive gas flow rate ranging from about 1 to about 500 sccm, an upper electrode (UEL) (e.g., element 52 in FIG. 5) RF bias ranging from about 0 to about 2000 W, and a lower electrode (LEL) (e.g., element 20 in FIG. 5) RF bias ranging from about 10 to about 1000 W. Also, the upper electrode bias frequency can range from about 0.1 MHz to about 200 MHz, e.g., 60 MHz. In addition, the lower electrode bias frequency can range from about 0.1 MHz to about 100 MHz, e.g., 2 MHz.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of forming a damascene structure on a substrate, comprising:
    preparing a film stack on said substrate, said film stack comprising a SiCOH-containing layer formed on said substrate, a silicon oxide ($SiO_x$) layer formed on said SiCOH-containing layer, and a first mask layer formed on said silicon oxide layer;
    forming a trench pattern in said first mask layer;
    transferring said trench pattern in said first mask layer to said silicon oxide layer;
    removing said first mask layer;
    following said removal of said first mask layer, forming a second mask layer on said silicon oxide layer;
    forming a via pattern in said second mask layer;
    transferring said via pattern to said SiCOH-containing layer using a first etching process;
    removing said second mask layer;
    following said removal of said second mask layer, transferring said trench pattern in said silicon oxide layer to said SiCOH-containing layer using a second etching process with plasma formed from a process composition consisting of $NF_3$ and an optional noble gas, wherein said second etching process achieves etch selectivity between said SiCOH-containing layer and said silicon oxide layer; and
    forming an etch stop layer on said substrate underlying said SiCOH-containing layer,
    wherein said transferring said via pattern to said SiCOH-containing layer stops on said etch stop layer, and
    wherein said etch stop layer comprises silicon carbide ($Si_xC_y$), silicon carbonitride ($SiC_xN_y$), or $SiC_xN_yH_z$, or a combination of two or more thereof.

2. The method of claim 1, wherein said transferring said via pattern to said SiCOH-containing layer comprises fully transferring said via pattern through the thickness of said SiCOH-containing layer prior to removing said second mask layer.

3. The method of claim 1, wherein said transferring said via pattern to said SiCOH-containing layer comprises partially transferring said via pattern, and wherein said via pattern is fully transferred to said SiCOH-containing layer during said transferring of said trench pattern to said SiCOH-containing layer.

4. The method of claim 1, wherein said first etching process utilizes plasma formed from a process composition comprising $NF_3$.

5. The method of claim 1, wherein said first etching process utilizes plasma formed from a process composition comprising a $C_xF_yH_z$ gas, and wherein x and y are integers greater than or equal to unity, and z is an integer greater than or equal to zero.

6. The method of claim 1, further comprising:
    forming a metal-containing layer overlying said silicon oxide layer, wherein said trench pattern is transferred to said metal-containing layer prior to transferring said trench pattern to said SiCOH-containing layer using said first mask layer.

7. The method of claim 6, wherein said metal-containing layer comprises titanium (Ti), titanium nitride ($Ti_xN_y$), tantalum (Ta), tantalum nitride ($Ta_xN_y$), aluminum (Al), or aluminum-copper alloy (Al—Cu).

8. The method of claim 1, further comprising:
    forming a hard mask layer underlying silicon oxide layer, wherein said trench pattern is transferred to said hard mask layer prior to transferring said trench pattern to said SiCOH-containing layer using said first mask layer.

9. The method of claim 1, wherein said preparing said film stack comprises forming a first mask layer using a 248 nm photo-resist, a 193 nm photo-resist, a 157 nm photo-resist, an EUV photo-resist, or an electron sensitive resist, or a combination of two or more thereof.

10. The method of claim 1, wherein said preparing said film stack comprises forming a first mask layer having a lithographic layer overlying an anti-reflective coating (ARC).

11. The method of claim 1, further comprising:
    during said transferring said trench pattern in said silicon oxide layer to said SiCOH-containing layer, controlling the temperature of said substrate.

12. The method of claim 11, wherein the temperature of said substrate ranges from approximately 10 degrees C. to approximately 50 degrees C.

13. The method of claim 1, wherein said removing said first mask layer comprises using an ashing plasma having oxygen.

14. The method of claim 1, wherein said removing said second mask layer comprises using an ashing plasma having oxygen.

* * * * *

UNITED STATES PATENT AND TRADEMARK OFFICE
CERTIFICATE OF CORRECTION

| | | |
|---|---|---|
| PATENT NO. | : 7,935,640 B2 | |
| APPLICATION NO. | : 11/836977 | |
| DATED | : May 3, 2011 | |
| INVENTOR(S) | : Yannick Feurprier | |

It is certified that error appears in the above-identified patent and that said Letters Patent is hereby corrected as shown below:

Col. 14, line 23, Claim 8, "underlying silicon oxide layer," should read --underlying said silicon oxide layer,--.

Signed and Sealed this
Second Day of August, 2011

David J. Kappos
*Director of the United States Patent and Trademark Office*